(12) United States Patent
Inoue (10) Patent No.: US 6,647,320 B1
(45) Date of Patent: Nov. 11, 2003

(54) SOFTWARE-BASED TEMPERATURE CONTROLLER CIRCUIT IN ELECTRONIC APPARATUS

(75) Inventor: Naoyuki Inoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/537,343

(22) Filed: Mar. 29, 2000

(30) Foreign Application Priority Data

Sep. 13, 1999 (JP) .......................................... 11-258249

(51) Int. Cl.⁷ .............................................. G05D 23/00
(52) U.S. Cl. ...................................... 700/300; 361/695
(58) Field of Search ............................... 700/299, 300, 700/79; 713/300

(56) References Cited

U.S. PATENT DOCUMENTS

| | | | |
|---|---|---|---|
| 5,230,074 A | | 7/1993 | Canova, Jr. et al. .......... 714/14 |
| 5,574,667 A | * | 11/1996 | Dinh et al. ................. 700/300 |
| 5,723,998 A | | 3/1998 | Saito et al. ................. 327/513 |
| 5,752,011 A | | 5/1998 | Thomas et al. ............. 713/501 |
| 5,838,578 A | | 11/1998 | Pippin ........................... 716/4 |
| 5,870,614 A | * | 2/1999 | Ang ............................. 713/320 |
| 5,907,689 A | | 5/1999 | Tavallaci et al. ............ 710/110 |
| 5,926,386 A | * | 7/1999 | Ott et al. ....................... 700/70 |
| 5,930,110 A | | 7/1999 | Nishigaki et al. ........... 361/686 |
| 6,014,611 A | * | 1/2000 | Arai et al. ................... 702/132 |
| 6,212,644 B1 | * | 4/2001 | Shimoda et al. ............. 713/324 |
| 6,216,235 B1 | * | 4/2001 | Thomas et al. ............. 713/501 |
| 6,225,911 B1 | * | 5/2001 | Nagamasa et al. .......... 340/635 |
| 6,338,150 B1 | * | 1/2002 | Johnson et al. ............... 714/39 |
| 6,363,490 B1 | * | 3/2002 | Senyk ......................... 713/300 |
| 6,405,320 B1 | * | 6/2002 | Lee et al. ................... 713/300 |
| 6,487,463 B1 | * | 11/2002 | Stepp, III .................... 700/79 |
| 6,526,333 B1 | * | 2/2003 | Henderson et al. ......... 700/300 |

FOREIGN PATENT DOCUMENTS

| | | |
|---|---|---|
| EP | 0 840 226 | 5/1998 |
| JP | 5-6691 | 1/1993 |
| JP | 7-5958 | 1/1995 |
| JP | 8-328698 | 12/1996 |

\* cited by examiner

*Primary Examiner*—Leo Picard
*Assistant Examiner*—Zoila Cabrera
(74) *Attorney, Agent, or Firm*—Staas & Halsey LLP (57) ABSTRACT

The central processing unit (CPU) is allowed to utilize the temperature information signal, identifying the temperature, so as to commence an interruption processing for controlling the temperature. During implementation of the interruption processing, the CPU is designed to recognize the status of the cooling device in accordance with the status information signal. If a failure or defect is found in the cooling device, a thinned-out clock signal or a clock signal of a lower frequency is supplied to the CPU so as to suppress the operation of the CPU. Heat generated at the CPU can be suppressed. An additional hardware is not required to accompany the CPU so as to solely generate an interrupt request signal based on the status of the cooling device. The circuit structure of the temperature controller circuit can be simplified.

23 Claims, 9 Drawing Sheets

SOFTWARE-BASED TEMPERATURE CONTROLLER CIRCUIT IN ELECTRONIC APPARATUS

BACKGROUND OF THE INVENTION

1. Field of the Invention

The present invention relates to a method of controlling temperature in an electronic apparatus such as a computer device, more particularly, to a method of changing the operation of a central processing unit (CPU) based on an information signal identifying the status of a cooling device such as a cooling fan installed within the computer device.

2. Description of the Prior Art

In general, a cooling fan is disposed within an enclosure of a computer system. The cooling fan is designed to generate air stream for taking out heat from a CPU and thereafter flowing out of the enclosure. The air stream serves to suppress the interior temperature of the enclosure from increasing. Employment of no cooling fan induces an excessive temperature increase within the enclosure, so that the CPU and other electronic components in the vicinity of the CPU may suffer from any defect or failure of operation.

If the cooling fan fails to properly operate, the heat generated at the CPU cannot be released out of the enclosure enough. In this case, the operation of the CPU is preferably suppressed to reduce the generated heat so that the increase can be avoided in the interior temperature. The suppression can be achieved by a reduced or thinned-out frequency of the clock signal supplied to the CPU, for example.

When the operation of the CPU is to be suppressed, the CPU is expected to receive an interrupt request IRQ for identifying defect or failure of the cooling fan. When the CPU receives the interrupt request IRQ, the CPU is designed to temporarily discontinue the current primary processing so as to realize establishment of a reduced or thinned-out frequency of the clock signal in an interruption processing. As a result of suppression of the operation in the CPU in this manner, an excessive increase can be prevented in the interior temperature of the enclosure.

The interrupt request IRQ is usually supplied from a system controller such as a chipset, for example. The system controller is thus required to include a hardware or electronic component for generating an interrupt request IRQ. The circuit structure of the system controller inevitably gets complicated. In addition, reduction in size cannot be achieved in the system controller due to the hardware for generating an interrupt request IRQ.

SUMMARY OF THE INVENTION

It is accordingly an object of the present invention to provide a temperature controller circuit capable of managing the interior temperature of an electronic apparatus with a simpler circuit structure, and a method therefor.

According to the present invention, there is provided a temperature controller circuit for an electronic apparatus, comprising: a central processing unit (CPU); an interrupt request generating unit generating an interrupt request signal based on a temperature information signal identifying a temperature and designed to output the interrupt request signal to the central processing unit; and an input unit designed to supply to the central processing unit a status information signal identifying status of a cooling device.

Employment of the above-described temperature controller circuit may serve to implement a method of controlling temperature in an electronic apparatus according to the present invention. The method may comprise: obtaining an interrupt request signal based on a temperature information signal for identifying a temperature; obtaining a status information signal for identifying status of a cooling device in response to reception of the interrupt request signal; and changing operation of a central processing unit based on the status information signal.

With the above-described method, the central processing unit (CPU) is allowed to utilize the temperature information signal, identifying the temperature, so as to commence an interruption processing for controlling the temperature. During the interruption processing, the CPU is designed to recognize the status of the cooling device in accordance with the status information signal. An additional hardware is not required to accompany the CPU so as to solely generate an interrupt request signal based on the status of the cooling device. The circuit structure of the temperature controller circuit can be simplified.

In general, in the case where the cooling device is employed to control the temperature in the electronic apparatus, a failure or defect of the cooling device can be ignored if the temperature is properly controlled, in other words, if the temperature stays below a predetermined temperature. If an interrupt request signal is designed to be generated in response to the failure or defect of the cooling device as is conventionally known, the operation of the CPU is correspondingly interrupted irrespective of the proper temperature in the electronic apparatus. On the other hand, according to the present invention, the temperature information signal is designed to trigger the generation of the interrupt request signal, so that the CPU is reliably prevented from suffering from a frequent interruption during the operation as long as the temperature is properly controlled irrespective of a failure or defect of the cooling device.

A temperature detector or thermal sensor may be connected to the interrupt request generating unit so as to measure the actual temperature within the enclosure of the electronic apparatus. The thermal sensor serves to achieve a proper generation of the interrupt request signal in correspondence with variation in the actual temperature within the enclosure of the electronic apparatus. The control of the cooling device based on the thus generated interrupt request signal serves to avoid an excessive increase in the temperature within the enclosure of the electronic apparatus. The thermal sensor may be designed to directly measure the temperature of the CPU.

For example, the input unit may comprise a general purpose input (GPI) circuit incorporated within a system controller (chipset) or a so-called ultra I/O (Input/Output). The system controller and the ultra I/O are in general designed to support the operation of the CPU. The system controller may comprise a north bridge connected to the CPU through a system bus, and a south bridge connected to the north bridge through a PCI bus, for example.

The cooling device may include a cooling fan designed to generate air stream for taking out heat from the CPU, for example. However, the cooling device is not limited to the cooling fan. The cooling device is only required to prevent an excessive increase in the temperature within the enclosure of the electronic apparatus by any means.

In the aforementioned method, the operation of the CPU may be suppressed in response to reception of the status information signal identifying a failure or defect of the cooling device. The suppression in the operation of the CPU serves to suppress heat generated at the CPU. Accordingly, an increase in the temperature within the enclosure can be suppressed. The suppressed operation of the CPU may also be achieved when the status information signal identifies a compulsive termination of the operation of the cooling device due to an intentional reduction in energy consumption.

In the aforementioned method, a thinned-out clock signal may be supplied to the central processing unit so as to suppress the operation of the central processing unit. Likewise, a clock signal of a lower clock frequency may be supplied to the central processing unit so as to suppress the operation of the central processing unit. Otherwise, a software managing the overall system such as an operating system (OS) may be suspended or shut down in suppressing the operation of the CPU.

Furthermore, the aforementioned method may be realized by a computer software such as a BIOS (Basic Input/Output System). The computer software maybe installed to the computer system from a mobile storage media such as a magnetic disk, including an FD (floppy disk), an optical disk, including a CD (compact disk), or the like. Alternatively, the computer software may be installed to the computer system through a network such as the Internet.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
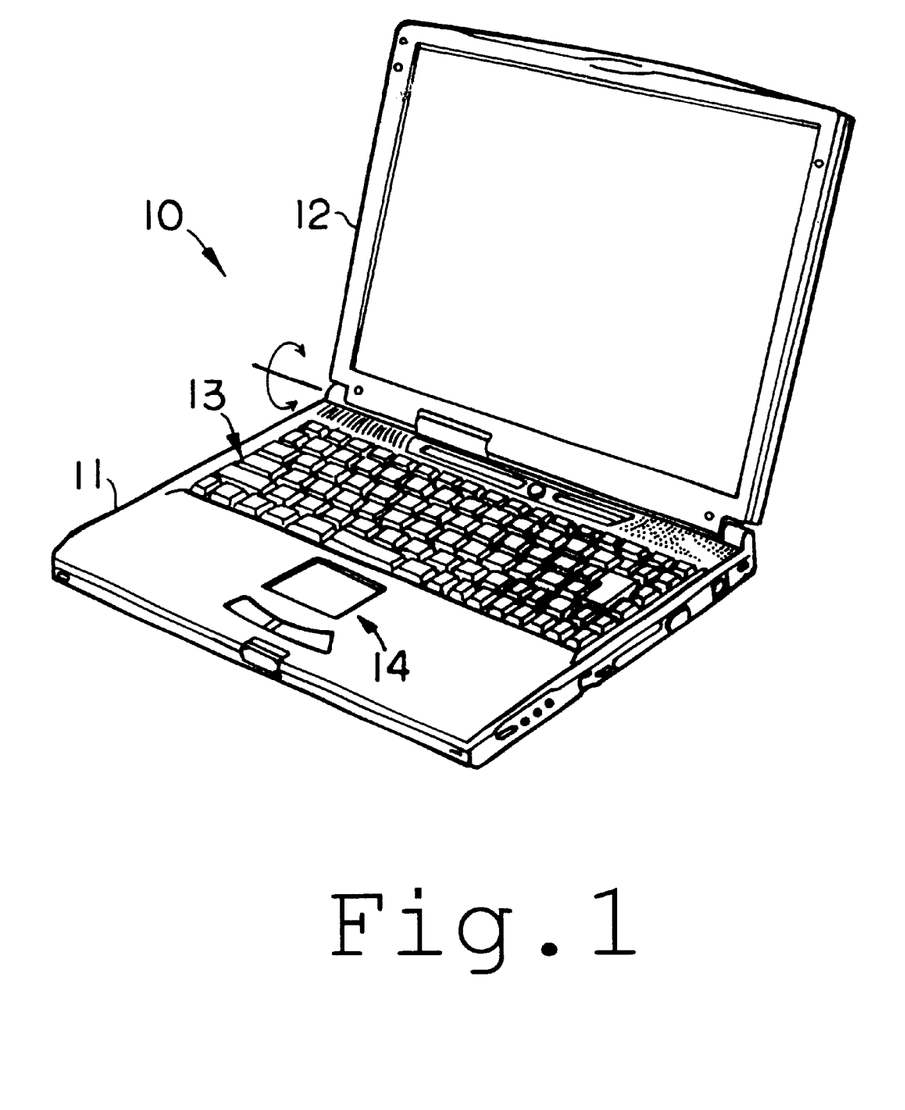
FIG. 1 illustrates the overall appearance of a notebook type personal computer.

FIG. 1 schematically illustrates a notebook type personal computer 10 as an electronic apparatus. The personal computer 10 comprises a main enclosure 11 in which a central processing unit (CPU) and other electronic components are incorporated, and a lid 12 connected to the main enclosure 11. A liquid crystal display (LCD) and the like is incorporated in the lid 12. The lid 12 is allowed to swing, relative to the main enclosure 11, about the support axis. The swinging movement of the lid 12 is designed to cause the lid 12 to be superposed on the main enclosure 11.

Input devices such as a keyboard 13 and a pointing device 14 are mounted over the upper surface of the main enclosure 11. When an application software is executed in the personal computer 10, an operator is expected to manipulate the keyboard 13 and/or the pointing device 14 so as to input required information and/or instructions. Process and/or result of execution of the application software may be displayed on the screen of the LCD incorporated in the lid 12.

Figure 2:
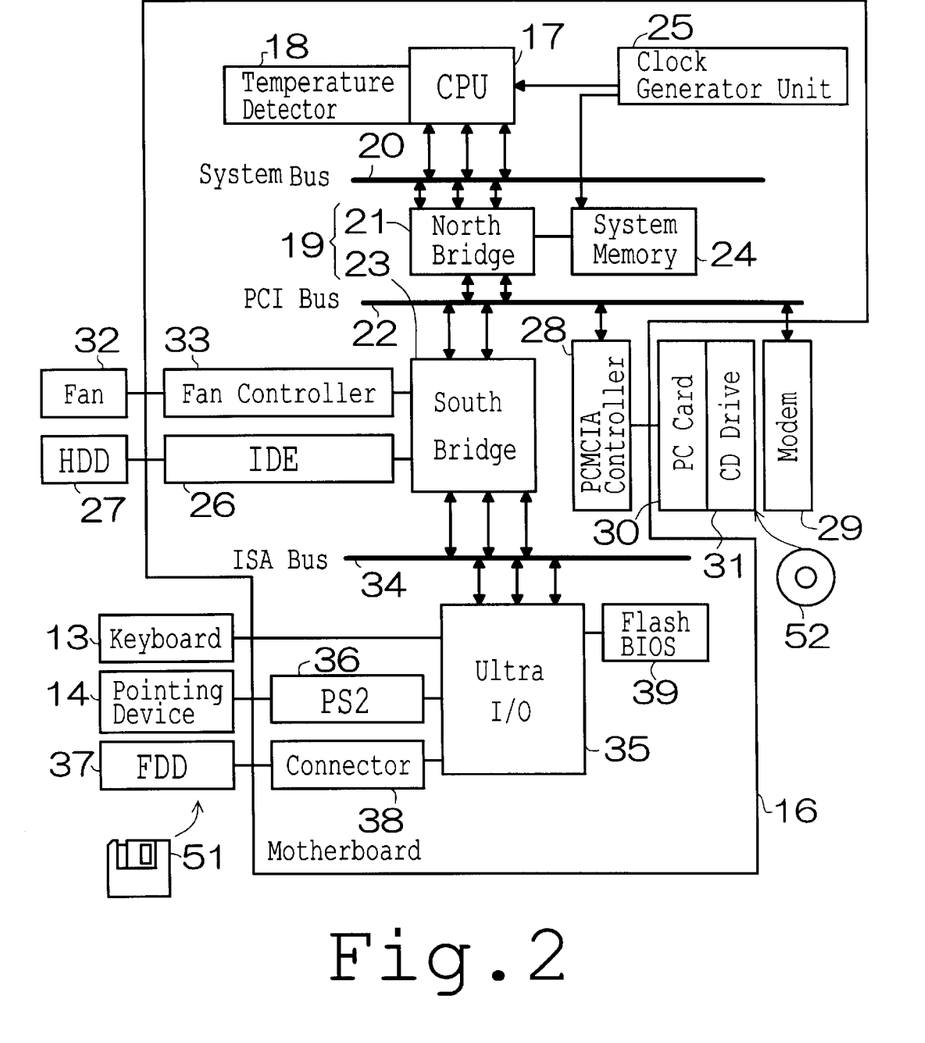
FIG. 2 is a block diagram schematically illustrating the circuit structure of a motherboard.

FIG. 2 schematically illustrates the circuit structure of a printed circuit board unit such as a motherboard 16 incorporated within the main enclosure 11. A CPU 17 is mounted on the motherboard 16 for executing an application software on an operating system (OS), for example. A surface mount technique may be employed to mount the CPU 17 on the motherboard 16. Alternatively, the CPU 17 may be received within a CPU slot fixedly mounted on the motherboard 16.

A temperature detector or thermal sensor 18 is embedded within a silicon body of the CPU 17 for detecting a temperature of the CPU 17. The temperature detector 18 is designed to generate a temperature information signal identifying the temperature of the CPU 17. In generation of the temperature information signal, the temperature detector 18 compares a measured actual temperature with a predetermined threshold temperature. When the measured actual temperature exceeds the predetermined threshold temperature, the temperature detector 18 is allowed to keep outputting a notification signal of a high level. When the measured actual temperature stays below the predetermined threshold temperature on the contrary, the temperature detector 18 is allowed to keep outputting the notification signal of a low level. The predetermined threshold temperature may be determined based on a highest permissible temperature for guaranteeing a reliable operation of the CPU 17 and other electronic components in the vicinity of the CPU 17.

A system controller such as a chipset 19 is connected to the CPU 17. The chipset 19 is designed to manage the overall system of the personal computer 10. The chipset 19 comprises, for example, a north bridge 21 connected to the CPU through a system bus 20, and a south bridge 23 connected to the north bridge 21 through a so-called PCI (Peripheral Component Interconnect) bus 22.

A system memory unit 24 is connected to the north bridge 21. The north bridge 21 serves to allow the CPU 17 to fetch programs of the OS and/or application software temporarily stored in the system memory unit 24. Memory modules such as a synchronous dynamic random access memory (SDRAM) can be employed as the system memory unit 24. The memory modules may be received within corresponding DIMM (dual in-line memory module) connectors fixedly mounted on the motherboard 16, for example.

A clock signal is supplied to the CPU 17 and the system memory unit 24, respectively. The clock signal is generated at a clock generator unit or circuit 25. The operational speed of the CPU 17 can be determined by the frequency of the clock signal. The clock signal may be supplied to the north and south bridges 21, 23 and other electronic components or elements, in addition to the CPU 17 and the system memory unit 24. As a result, the north and south bridges 21, 23 and the other electronic components are designed to operate in synchronization with the operation of the CPU 17.

A so-called IDE (Integrated Device Electronics) connector 26 is connected to the south bridge 23 so as to establish an IDE interface. For example, the IDE connector 26 allows for connection of a large-capacity storage device such as a hard disk drive (HDD) 27 assembled within the main enclosure 11. When the CPU 17 executes an application software, for example, the south bridge 23 serves to transfer programs and/or data, read out of the HDD 27, to the system memory unit 24.

A PCMCIA (Personal Computer Memory Card International Association) controller unit 28 and a modem 29 are respectively connected to the PCI bus 22. A PC card slot is electrically connected to the PCMCIA controller unit 28. When a PC card is received in the PC card slot, as is conventionally known, a specific interface such as an IDE or SCSI interface can be established between the north bridge 21 and an exterior peripheral device such as a compact disk (CD) drive 31, including a CD-ROM or CD-R or CD-RW drive. In addition, a phone or communication line can be connected to the modem 29. The line may be wired or wireless. The modem 29 serves to connect the CPU 17 to a network such as the Internet, an extranet, or the like.

A cooling device such as a cooling fan 32 is incorporated within the main enclosure 11 for generating air stream. The generated air stream is expected to escape out of the main enclosure 11 after absorbing heat within the main enclosure 11.

The cooling fan 32 is expected to suppress an increase in the interior temperature of the main enclosure 11. A fan controller unit or circuit 33 serves to control the operation or rotation of the cooling fan 32. The fan controller unit 33 is designed to output an alarm signal when it detects any defect or failure in the operation or rotation of the cooling fan 32.

A so-called ultra I/O (input/output circuit or unit) 35 is connected to the south bridge 23 through a so-called ISA (Industry Standard Architecture) bus 34. A pin terminal for the keyboard 13, a so-called PS/2 (Personal System/2) connector 36 for receiving a connector terminal of the pointing device 14, and a so-called FDD (Floppy Disk Drive) connector 38 for receiving a connector terminal of an FDD 37, are respectively connected to the ultra I/O 35. Moreover, a PS/2 connector for receiving a connector terminal of an additional external keyboard, or a PS/2 connector for receiving a connector terminal of an external mouse device, both not shown, may likewise be connected to the ultra I/O 35.

A so-called flash memory (EEPROM: electrically erasable and programmable ROM, for example) 39 is connected to the ultra I/O 35 for storing a BIOS (Basic Input/Output System). The CPU 17 is designed to manage the input/output operation between the OS and the fundamental peripheral devices such as the LCD, the keyboard 13, the pointing device 14, the HDD 27, and the like, in accordance with the BIOS read out from the flash memory 39.

Figure 3:
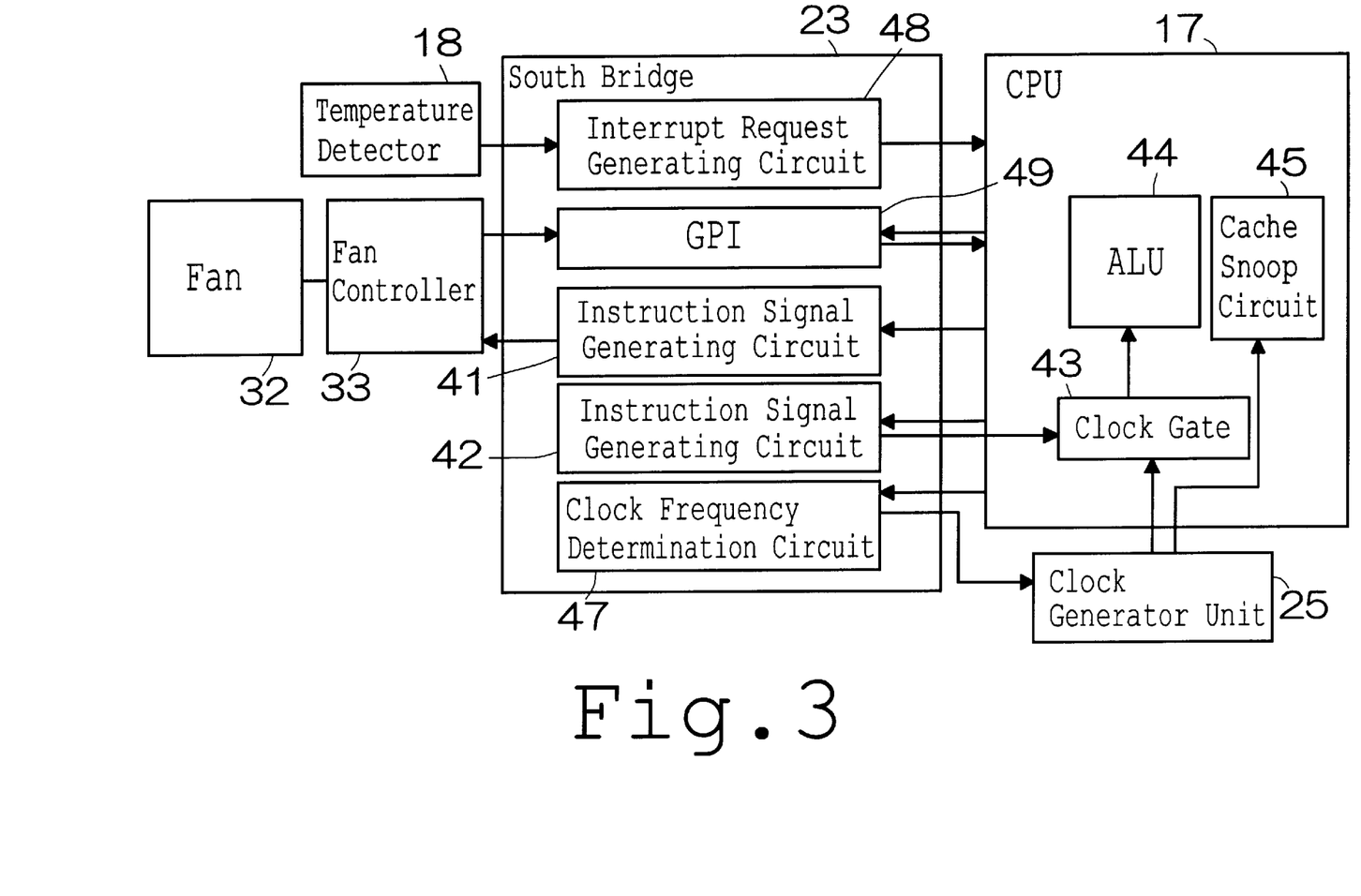
FIG. 3 is a block diagram schematically illustrating the structure of a south bridge.

As shown in FIG. 3, the south bridge 23 comprises an instruction signal generating circuit 41 designed to generate a fan instruction signal in accordance with instructions issued from the CPU 17. The fan instruction signal may include a trigger information signal for identifying an instruction to start or terminate a rotation of the cooling fan 32, a numerical information signal for identifying the number of rotation to be set at the cooling fan 32, and the like. The fan controller unit 33 is designed to control the operation or rotation of the cooling fan 32 in accordance with the instruction and the number identified in the fan instruction signal.

An instruction signal generating circuit 42 is likewise designed to generate a clock-gate instruction signal STPCLK# in accordance with instructions issued from the CPU 17. The clock-gate instruction signal STPCLK# may include information for identifying whether or not the clock signal is thinned out, how many clocks are made inoperative when the clock signal is thinned out, and the like. A clock gate 43 of the CPU 17 is designed to realize a thinned-out or a throttled clock signal in accordance with the information included in the received clock-gate instruction signal STPCLK#.

If a normal clock signal, without being thinned out or throttled, is supplied to the CPU 17, the CPU 17 is allowed to operate at the maximum operational speed which is inherent to the clock frequency of the clock signal. For example, when the clock gate 43 receives the clock-gate instruction signal STPCLK# identifying the "10% thinned-out," the clock gate 43 is adapted to alternately realize supply of the clock signal for 90 ns and interruption of the supply for 10 ns. Accordingly, an ALU (arithmetical and logical unit) 44 is caused to alternately repeat the continuation and the discontinuation of the operation by the ratio of 9 to 1. The load to the ALU 44 can be suppressed to 90% of the maximum load permissible to the ALU 44. Such suppression in the load of the ALU 44 is expected to contribute to suppression of heat generated at the CPU 17. It should be noted that the thinned-out or throttled clock signal can be supplied to electronic components, including the ALU 44, which are designed to accept an intermittent operation, while the thinned-out clock signal cannot be supplied to electronic components, such as a cache snoop circuit 45, which are required to keep operating.

A clock frequency determination circuit 47 is designed to generate a clock frequency determination signal in accordance with instructions issued from the CPU 17. The clock frequency determination signal may include information for identifying the clock frequency of the clock signal. The clock generator unit 25 is designed to output the clock signal at the clock frequency identified in the received clock frequency determination signal. The clock frequency can be switched over between the maximum or highest frequency allowing the CPU 17 to operate at the maximum operational speed and a low frequency set lower than the maximum frequency. When the CPU 17 operates in response to the clock signal of the low frequency, it is expected that heat generated at the CPU 17 can be suppressed as compared with the case where the CPU 17 operates at the maximum operational speed.

An interrupt request generating circuit 48 is designed to generate an interrupt request signal INTR when it detects a rise to the high level or a drop to the low level in the notification signal issued from the temperature detector 18. The interrupt request signal INTR is supplied to the CPU 17. When the CPU 17 receives the interrupt request signal INTR, the CPU 17 is forced to interrupt the current processing so as to thereafter execute an interruption processing assigned to the interrupt request signal INTR. In place of the interrupt request signal INTR, a SMI# signal (System Management Interrupt signal) of a higher priority can be employed to trigger the execution of the interruption processing in the CPU 17.

A GPI (General Purpose Input) circuit 49 comprises a register, not shown, designed to hold a binary data, namely, a value "0" or a value "1" in accordance with the presence of the alarm signal supplied from the fan controller unit 33. The CPU 17 is allowed to fetch the binary data out of the register. The fetched binary data may comprise a status information signal identifying the status of the cooling fan 32.

Now, when the personal computer 10 is booted up, the CPU 17 starts to operate based on the OS read out of the HDD 27 and the BIOS read out of the flash memory 39. The CPU 17 is designed to cause the instruction signal generating circuit 41 of the south bridge 23 to output the fan instruction signal. If the CPU 17 executes an application software under a heavy load, a relatively higher heat may be generated at the operating CPU 17. The heat may be transferred to air surrounding the CPU 17. The temperature rise is induced in the stuffy interior of the main enclosure 11. Rotation of the cooling fan 32 serves to generate air circulation between the interior and exterior of the main enclosure 11. The interior temperature of the main enclosure 11 is thus avoided from increasing to the utmost.

During the operation of the CPU 17, the temperature detector 18 keeps monitoring the actual temperature of the CPU 17. Assume that the measured actual temperature of the CPU 17 exceeds the predetermined threshold temperature in response to the increased heat at the CPU 17. When the measured actual temperature has exceeded the level of the predetermined threshold temperature, the notification signal generated at the temperature detector 18 is changed over from the low level to the high level. The interrupt request generating circuit 48 of the south bridge 23 outputs the interrupt request signal INTR to the CPU 17 in response to the rise from the low level to the high level in the notification signal.

Figure 4:
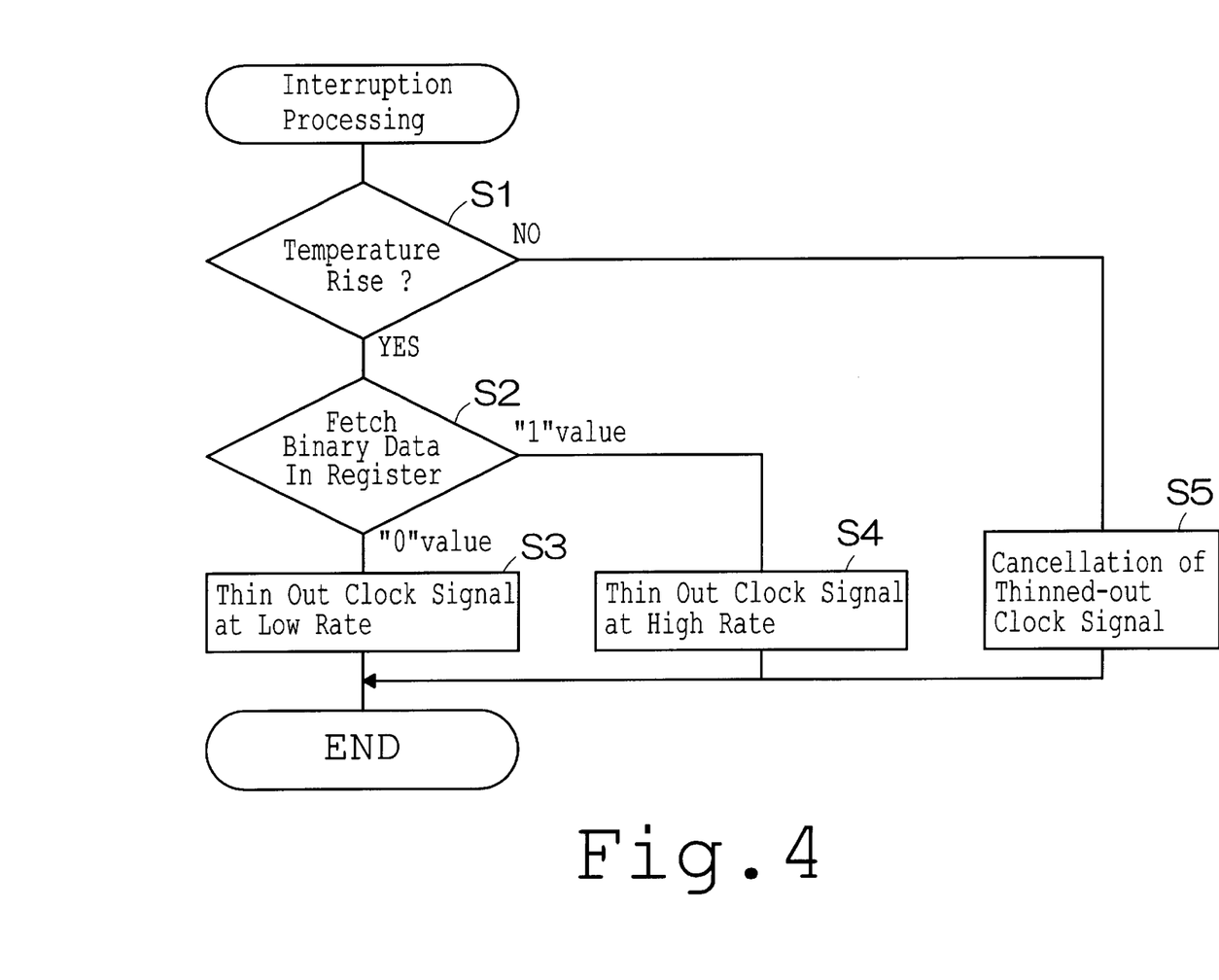
FIG. 4 is a flowchart illustrating an example of an interruption processing.

The CPU 17 is then caused to interrupt the current primary processing in response to the received interrupt request signal INTR. Thereafter, the CPU 17 starts to execute the interruption processing in accordance with the BIOS read out of the flash memory 39. When the CPU 17 executes the interruption processing, as shown in FIG. 4, the CPU 17 is designed to first determine whether the interrupt request signal INTR is output in response to the temperature rise exceeding the threshold temperature or the temperature drop falling below the threshold temperature, at step S1, for example. The determination of the CPU 17 can be achieved by counting reception of the interrupt request signals INTR, for example, since the CPU 17 is only allowed to alternately receive the interrupt request signals INTR for temperature rises and drops. Otherwise, the determination of the CPU 17 may be achieved by referring to the measured temperature at the temperature detector 18 in response to reception of the interrupt request signal INTR.

When the temperature rise has been recognized, the CPU 17 refers to the binary data of the register in the GPI circuit 49 at step S2. If the cooling fan 32 normally operates, the value "0" has been established in the register of the GPI circuit 49. The CPU 17 is thus designed to instruct generation of a clock signal, thinned out at a low rate, for achieving the moderate suppression of load at the CPU 17, at step S3. The instruction signal generating circuit 42 of the south bridge 23 generates the clock-gate instruction signal STPCLK# identifying the "10% thinned-out" in accordance with the instruction issued from the CPU 17, for example. The generated clock-gate instruction signal STPCLK# is supplied to the clock gate 43.

Figure 5:
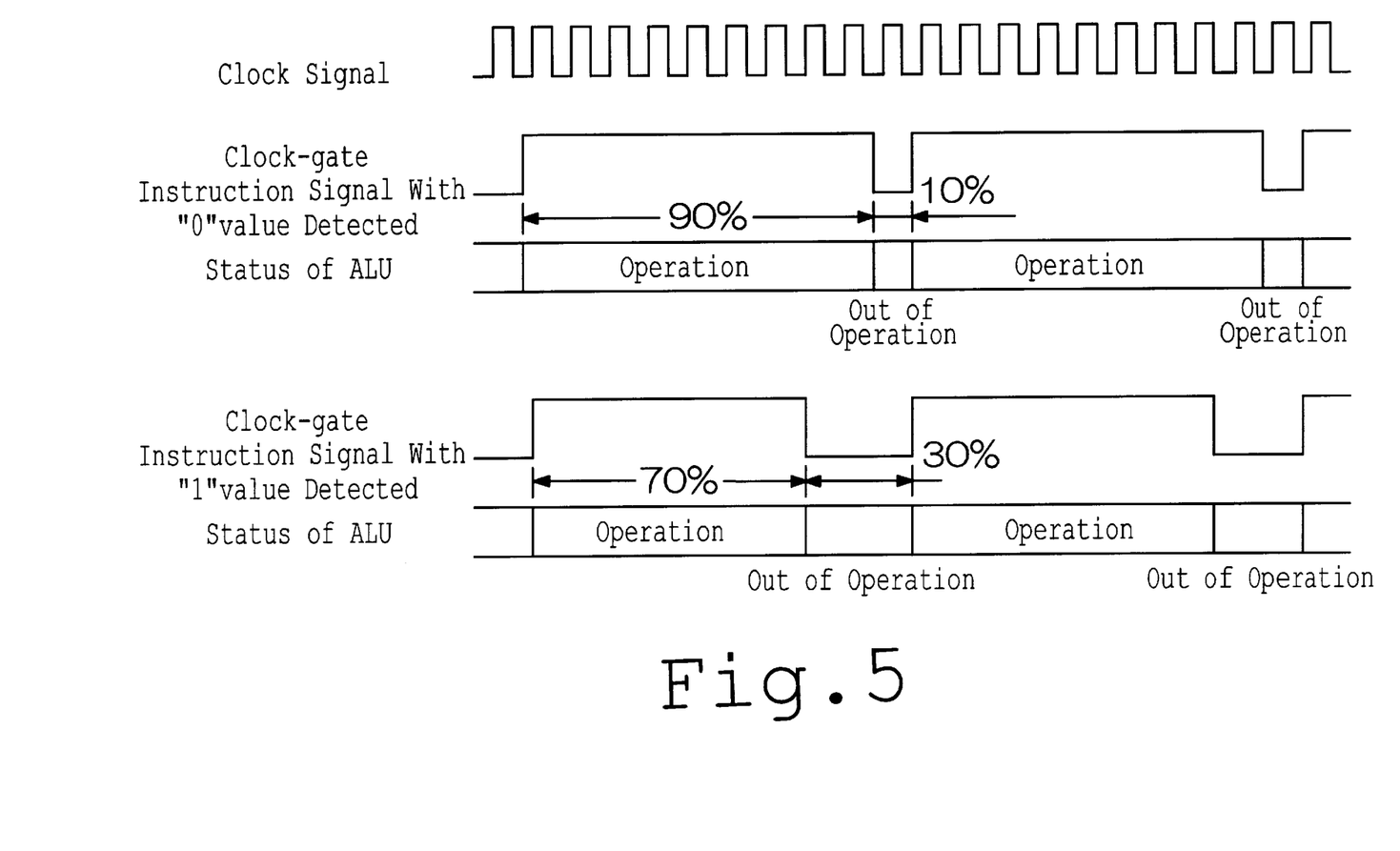
FIG. 5 is a time chart illustrating the concept of a thinned-out clock signal.

The clock gate 43 outputs the thinned out or throttled clock signal, as shown in FIG. 5, for example, in response to reception of the clock-gate instruction signal STPCLK#. The clock for 10% of a cyclic period is made ineffective in the thinned-out clock signal. Accordingly, the ALU 44 is allowed to alternately achieve the continuation and discontinuation of the operation in response to the supply of the effective and ineffective clock included in the thinned-out clock signal. The load to the ALU 44 can be suppressed to 90% of the maximum load permissible to the ALU 44. Although the CPU 17 operates at a low operational speed, heat generated at the CPU 17 can be suppressed. The thinned-out clock signal serves, in combination with a cooling performance achieved by the cooling fan 32, to prevent the interior temperature of the main enclosure 11 from increasing. The CPU 17 then completes the interruption processing. The CPU 17 is thereafter allowed to start a continuation of the interrupted primary processing.

Referring again to FIG. 4, the CPU 17 is designed to fetch the value "1" from the register of the GPI circuit 49, at step S2, if the alarm signal is output from the fan controller unit 33. As a result, the CPU 17 recognize a failure in the operation of the cooling fan 32. Otherwise, if the cooling fan 32 is intended to stop rotating so as to achieve suppression in energy consumption, the value "1" can be established in the register of the GPI circuit 49.

When a failure has been found in the operation of the cooling fan 32 in the aforementioned manner, the CPU 17 is designed to instruct generation of a clock signal, thinned out at a high rate, for achieving the tight or strong suppression of load at the CPU 17, at step S4. The instruction signal generating circuit 42 of the south bridge 23 generates the clock-gate instruction signal STPCLK# identifying the "30% thinned-out" in accordance with the instruction issued from the CPU 17, for example. The generated clock-gate instruction signal STPCLK# is supplied to the clock gate 43.

The clock gate 43 outputs the thinned out or throttled clock signal, as shown in FIG. 5, for example, in response to reception of the clock-gate instruction signal STPCLK#. The clock for 30% of a cyclic period is made ineffective in the thinned-out clock signal. Accordingly, the ALU 44 is allowed to alternately achieve the continuation and discontinuation of the operation in response to the supply of the effective and ineffective clock included in the thinned-out clock signal. The load to the ALU 44 can remarkably be suppressed to 70% of the maximum load permissible to the ALU 44. Heat generated at the CPU 17 can largely be suppressed as compared with the case achieved by the aforementioned 10% thinned-out clock signal. Without a cooling performance achieved by the cooling fan 32, the thinned-out clock signal solely serves to prevent the interior temperature of the main enclosure 11 from increasing. The CPU 17 then completes the interruption processing. The CPU 17 is thereafter allowed to start a continuation of the interrupted primary processing.

Next, assume that a cooling performance achieved by the cooling fan 32 and/or the thinned-out clock signal sufficiently reduces the interior temperature of the main enclosure 11 during the continuation of the interrupted primary processing. When the measured actual temperature has dropped below the predetermined threshold temperature, the notification signal generated at the temperature detector 18 is changed over from the high level to the low level. The interrupt request generating circuit 48 of the south bridge 23 outputs the interrupt request signal INTR to the CPU 17 in response to the drop from the high level to the low level in the notification signal.

The CPU 17 is then caused to interrupt the current primary processing in response to the received interrupt request signal INTR. Thereafter, the CPU 17 starts to execute the interruption processing in accordance with the BIOS read out of the flash memory 39. Here, when the temperature drop is recognized at step S1, the CPU is designed to instruct cancellation of the thinned-out clock signal without referring to the binary data of the register in the GPI circuit 49 at step S5. The instruction signal generating circuit 42 of the south bridge 23 generates the clock-gate instruction signal STPCLK# identifying the "0% thinned out," namely, the clock without being thinned out, in accordance with the instruction issued from the CPU 17. The generated clock-gate instruction signal STPCLK# is supplied to the clock gate 43. The clock gate 43 accordingly terminates the output of the thinned-out clock signal and starts outputting the normal continuous clock signal. The CPU 17 then completes the interruption processing. The CPU 17 is thereafter allowed to start a continuation of the interrupted primary processing. The ALU 44 is expected to bear the maximum load during operation.

Figure 6:
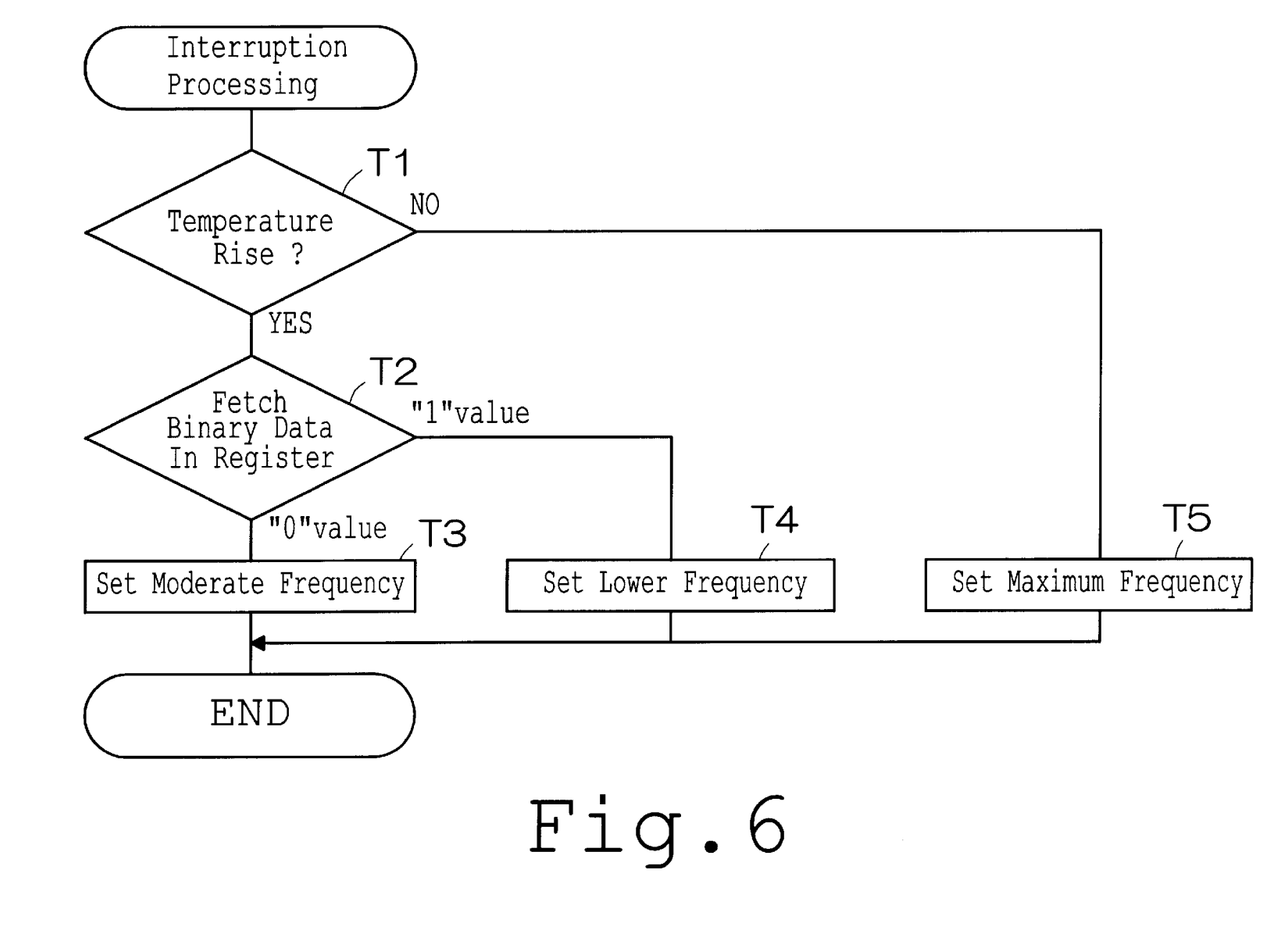
FIG. 6 is a flowchart illustrating another example of the interruption processing.

In place of the aforementioned thinned-out clock signal, the interruption processing may employ the change in the clock frequency of the clock signal supplied to the CPU 17. As shown in FIG. 6, when the temperature rise has been recognized in the aforementioned manner at step T1, in the same manner as described above, the CPU 17 is designed to refer to the binary data of the register in the GPI circuit 49 at step T2, for example. If the value "0" has been established in the register, at step T3, the CPU 17 instructs generation of the clock signal having a moderate frequency, such as 400 MHz, which is relatively lower than the maximum frequency, 500 MHz, for example. The clock frequency determination circuit 47 of the south bridge 23 generates the clock frequency determination signal identifying the clock frequency of 400 MHz in accordance with the instruction issued from the CPU 17. The generated clock frequency determination signal is supplied to the clock generator unit 25. The clock generator unit 25 supplies the clock signal having the clock frequency of 400 MHz to the CPU 17 in accordance with the received clock frequency determination signal. Although the CPU 17 operates at a relatively low or moderate operational speed, heat generated at the CPU 17 is expected to be suppressed. The moderate clock frequency serves, in combination with a cooling performance achieved by the cooling fan 32, to prevent the interior temperature of the main enclosure 11 from increasing. The CPU 17 is allowed to complete the interruption processing in this manner.

On the other hand, when the value "1" has been confirmed in the register of the GPI circuit 49 at step T2, in the same manner as described above, the CPU 17 instructs generation of the clock signal having a lower frequency, such as 250 MHz, which is still lower than the aforementioned moderate frequency, for example. The clock frequency determination circuit 47 of the south bridge 23 generates the clock frequency determination signal identifying the clock frequency of 250 MHz in accordance with the instruction issued from the CPU 17. The generated clock frequency determination signal is supplied to the clock generator unit 25. The clock generator unit 25 supplies the clock signal having the clock frequency of 250 MHz to the CPU 17 in accordance with the received clock frequency determination signal. Although the CPU 17 operates at a remarkably lower operational speed, heat generated at the CPU 17 is expected to largely be suppressed. Without assistance of a cooling performance achieved by the cooling fan 32, the lower clock frequency solely serves to prevent the interior temperature of the main enclosure 11 from increasing. The CPU 17 is allowed to complete the interruption processing in this manner.

Thereafter, when the temperature drop has been recognized at step T1, in the same manner as described above, the CPU 17 instructs generation of the clock signal having the maximum frequency, 500 MHz, at step T5. The clock frequency determination circuit 47 of the south bridge 23 generates the clock frequency determination signal identifying the clock frequency of 500 MHz in accordance with the instruction issued from the CPU 17. The generated clock frequency determination signal is supplied to the clock generator unit 25. Accordingly, after completion of the interruption processing in this manner, the CPU 17 is allowed to operate at the maximum operational speed possibly achieved by the set maximum clock frequency.

Figure 7:
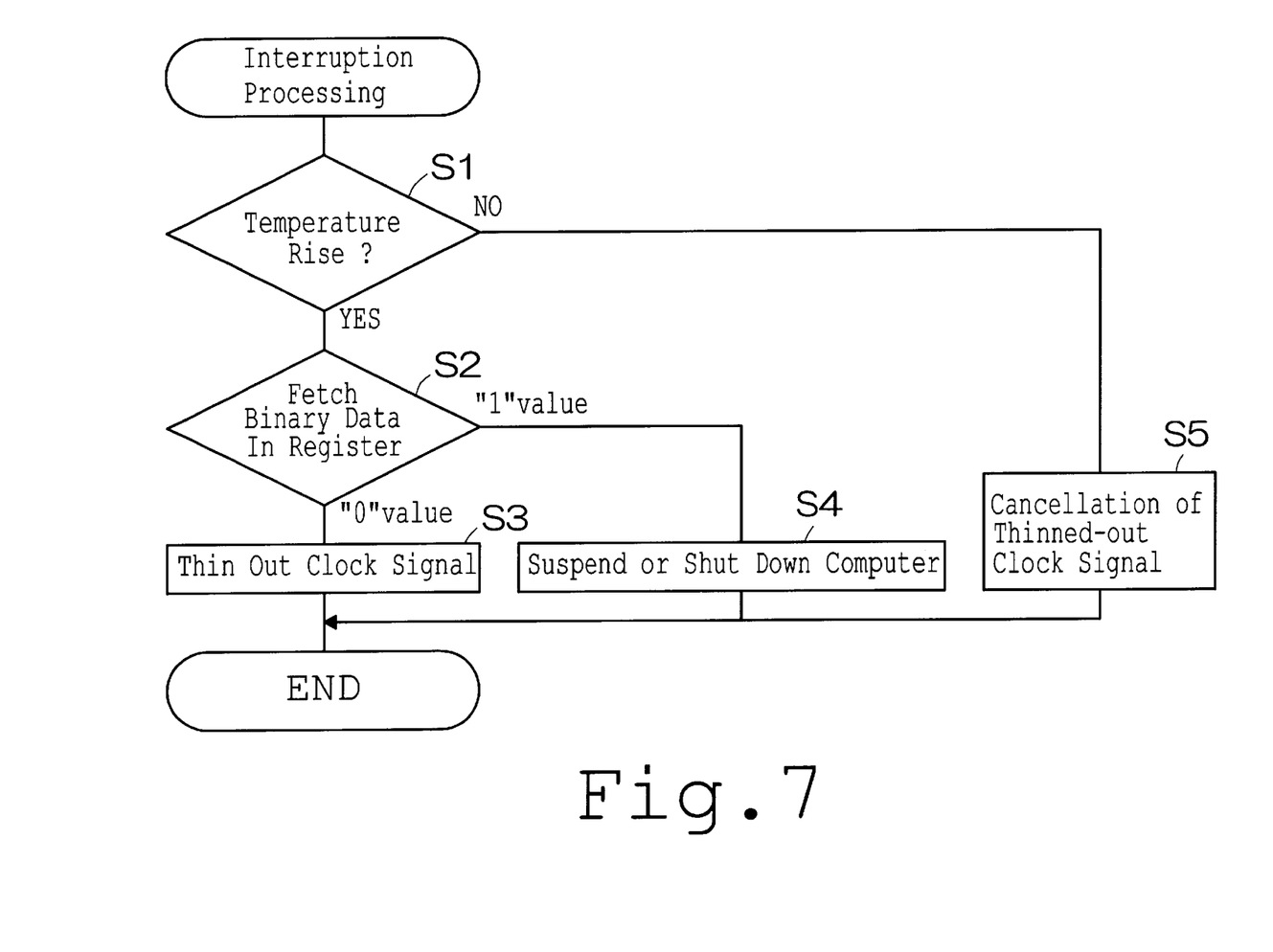
FIG. 7 is a flowchart illustrating further example of the interruption processing.
Figure 8:
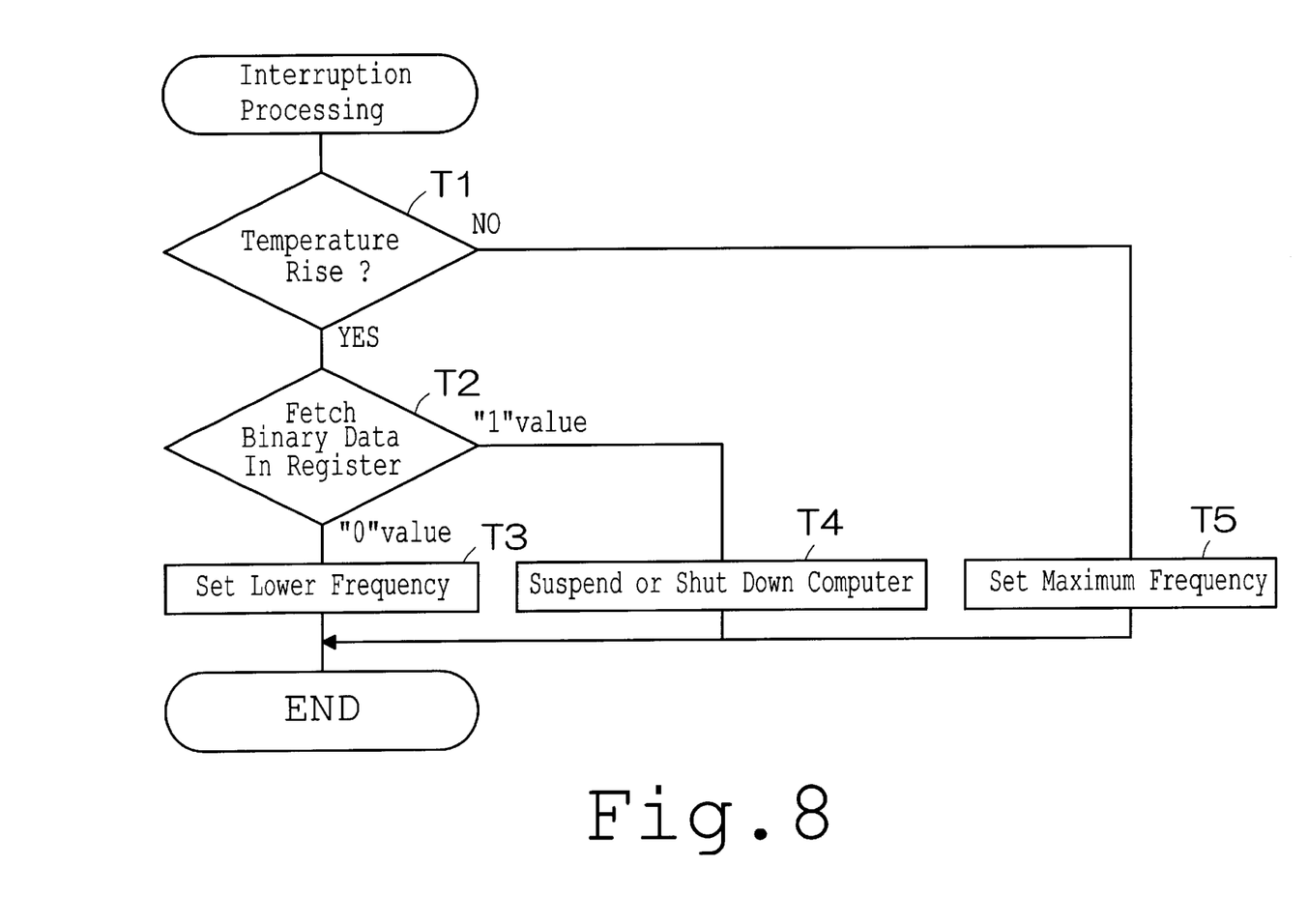
FIG. 8 is a flowchart illustrating still further example of the interruption processing.

The above-described interruption processing may force the personal computer 10 to be suspended or shut down, at steps S4 and T4, when a failure has been found in the operation of the cooling fan 32 at steps S2 and T2, as shown in FIGS. 7 and 8. As is conventionally known, the operation of a so-called ATX power supply interface, incorporated in the south bridge 23, can be utilized to suspend or shut down the personal computer 10 in the above manner, for example. If the personal computer 10 is suspended or shut down, the operation of the CPU 17 can be terminated so that heat generated at the CPU 17 can reliably be suppressed. In addition, two kinds of the thinned-out clock signal are not required in the interruption processing, as is apparent from FIG. 7, while two kinds of clock frequency for the clock signal may replace three kinds of clock frequency in the aforementioned interruption processing, as is apparent from FIG. 8.

Figure 9:
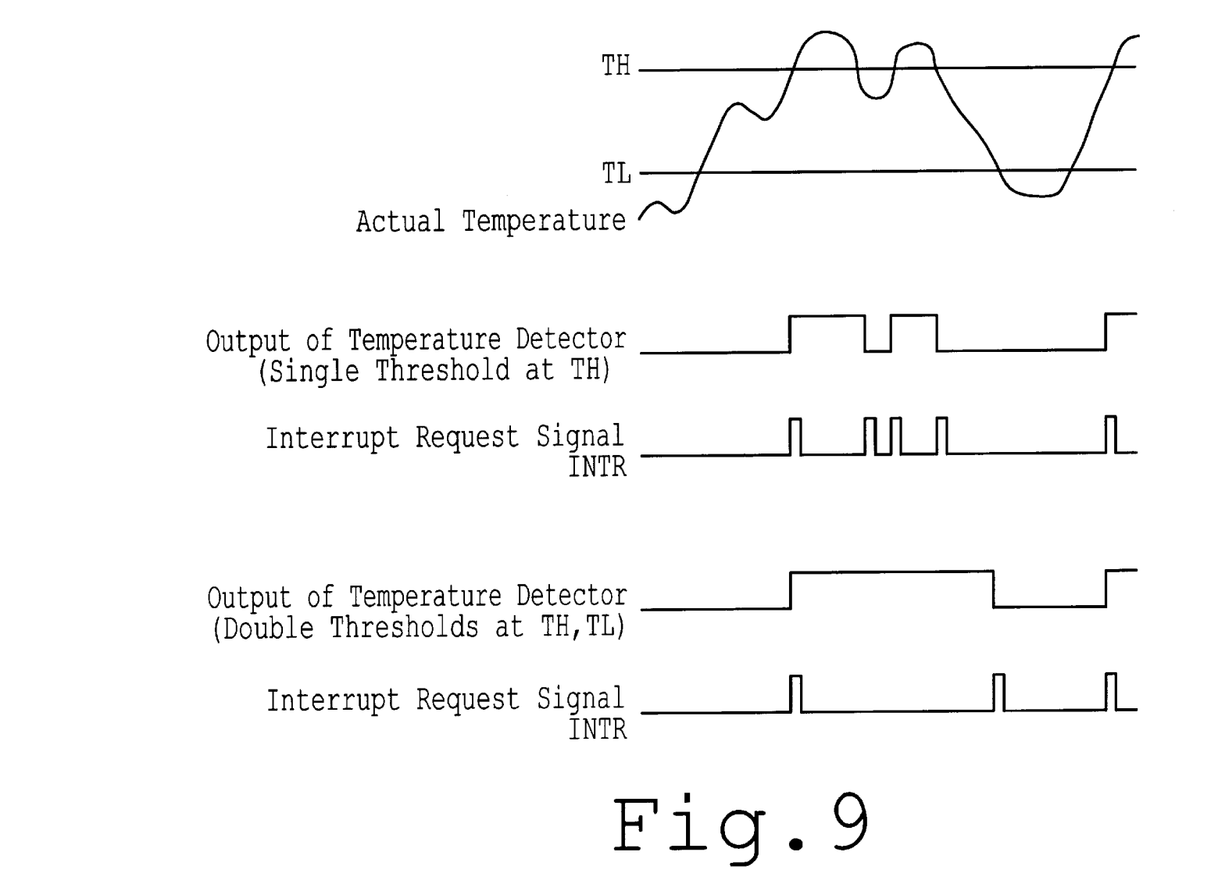
FIG. 9 is a time chart schematically illustrating the advantage of a threshold temperature for a temperature rise which is higher than a threshold temperature for a temperature drop.

The above-described interruption processing may be designed to set a pair of different predetermined threshold temperatures, for example, one for the temperature rise and the other for the temperature drop. Now, assume that the predetermined threshold temperature TH for the temperature rise is set higher than the predetermined threshold temperature TL. In this case, once the actual temperature rises above the threshold temperature TH, an insufficient up and down of the actual temperature in the range of the threshold temperature TH fails to cause frequent generation of the interrupt request signal INTR unless the actual temperature reaches below the threshold temperature TL. As compared with the case where the same value is set for the respective threshold temperatures for temperature rise and drop, generation of the interrupt request signal to be supplied to the CPU 17 can be suppressed or decreased. Accordingly, the CPU 17 is prevented from frequent interruption during the normal primary processing for executing an application software.

The BIOS for realizing the aforementioned interruption processing can be installed to the flash memory 39 from a mobile storage media such as an FD (floppy disk) 51 readable by the FDD 37, a CD-ROM 52 readable by the CD drive 31, or the like, as shown in FIG. 2. Alternatively, the BIOS may be installed to the flash memory 39 through a network connected to the modem 29. When the BIOS is to be installed, the CPU 17 may execute a specific software program realizing a tool for installation, for example. Such a specific software program may be fetched into the system memory unit 24 along with the BIOS prior to installation.

It should be noted that the aforementioned BIOS can be applied not only to the motherboard 16 employed in the notebook type personal computer 10 but also to a motherboard employed in a desktop personal computer in the same manner.

What is claimed is:

1. A temperature controller circuit for an electronic apparatus, comprising:

a central processing unit;

an interrupt request generating unit generating an interrupt request signal based on a temperature information signal identifying a temperature and designed to output the interrupt request signal to the central processing unit; and an input unit designed to supply to the central processing unit a status information signal identifying status of a cooling device when the central processing unit has received the interrupt request signal.

2. The temperature controller circuit according to claim 1, wherein the input unit is a general purpose input circuit.

3. The temperature controller circuit according to claim 1, wherein the temperature information signal is supplied from a temperature detector embedded in a body of the central processing unit.

4. The temperature controller circuit according to claim 3, wherein the temperature detector is designed to generate the temperature information signal based on a comparison between a measured actual temperature and a predetermined threshold temperature.

5. An electronic apparatus with a cooling device, comprising:

an enclosure, the cooling device incorporated in the enclosure;

a central processing unit disposed within the enclosure;

a temperature detector generating a temperature information signal identifying a temperature within the enclosure;

an interrupt request generating unit generating an interrupt request signal based on the temperature information signal and designed to output the interrupt request signal to the central processing unit; and an input unit designed to supply to the central processing unit a status information signal identifying status of the cooling device when the central processing unit has received the interrupt request signal.

6. The electronic apparatus according to claim 5, wherein the input unit is a general purpose input circuit.

7. The electronic apparatus according to claim 5, wherein the temperature detector is embedded in a body of the central processing unit.

8. The electronic apparatus according to claim 5, wherein the temperature detector is designed to generate the temperature information signal based on a comparison between a measured actual temperature and a predetermined threshold temperature.

9. A method of controlling temperature in an electronic apparatus, comprising:

causing a central processing unit to obtain an interrupt request signal based on a temperature information signal to identify a temperature;

causing the central processing unit to obtain a status information signal to identify status of a cooling device in response to a reception of the interrupt request signal; and causing the central processing unit to change an operation of the central processing unit based on the status information signal.

10. The method of controlling temperature according to claim 9, wherein the operation of the central processing unit is suppressed when a failure in an operation of the cooling device is identified in the status information signal.

11. The method of controlling temperature according to claim 10, wherein a thinned-out clock signal is supplied to the central processing unit in suppressing the operation of the central processing unit.

12. The method of controlling temperature according to claim 10, wherein a clock signal of a lower clock frequency is supplied to the central processing unit in suppressing the operation of the central processing unit.

13. A computer readable storage medium storing program instructions, comprising:

computer program code causing a central processing unit to obtain an interrupt request signal based on a temperature information signal to identify a temperature;

computer program code causing the central processing unit to obtain a status information signal to identify status of a cooling device in a response to reception of the interrupt request signal; and computer program code causing the central processing unit to change an operation of the central processing unit based on the status information signal.

14. A temperature controller circuit for an electronic apparatus, comprising:

a central processing unit;

an interrupt request generating unit generating an interrupt request signal according to a temperature, and outputting the interrupt request signal to the central processing unit; and an input unit supplying a status information signal identifying a status of a cooling device to the central processing unit after the central processing unit receives the interrupt request signal.

15. The temperature controller circuit according to claim 14, wherein the input unit includes a general purpose input circuit.

16. The temperature controller circuit according to claim 14, further comprising:

a temperature detector disposed in a body of the central processing unit, the temperature information signal being supplied from the temperature detector.

17. The temperature controller circuit according to claim 16, wherein the temperature detector generates the temperature information signal according to a comparison between a measured actual temperature and a predetermined threshold temperature.

18. An electronic apparatus including an enclosure with a cooling device therein, comprising:

a central processing unit disposed within the enclosure;

a temperature detector generating an information signal according to a temperature within the enclosure;

an interrupt request generating unit generating an interrupt request signal according to the information signal and outputting the interrupt request signal to the central processing unit; and an input unit supplying a status information signal providing status of the cooling device to the central processing unit after the central processing unit receives the interrupt request signal.

19. A method of controlling temperature in an electronic apparatus, comprising:

initiating an interrupt request signal to be obtained by a central processing unit according to temperature information;

initiating a status information signal to be obtained by the central processing unit according to a status of a cooling device responsive to the central processing unit receiving the initiated interrupt request signal; and initiating an operation of the central processing unit to be changed by the central processing unit according the initiated status information signal.

20. The method of controlling temperature according to claim 19, wherein the initiating an operation of the central processing unit comprises suppressing the operation of the central processing unit, when a failure in an operation of the cooling device is identified in the status information signal.

21. The method of controlling temperature according to claim 20, wherein the suppressing comprises
   setting a thinned-out clock signal according to the status information signal; and
   supplying the thinned-out clock signal to the central processing unit to change an operation thereof.

22. The method of controlling temperature according to claim 19, wherein the initiating an operation of the central processing unit comprises
   supplying a clock signal lower than a maximum clock signal to the central processing unit.

23. A computer readable storage medium storing program instructions, comprising:

program code for a central processing unit to obtain an interrupt request signal according to temperature information;

program code for the central processing unit to obtain a status signal according to a status of a cooling device responsive to the central processing unit receiving the interrupt request signal; and program code for the central processing unit to change an operation thereof according to the obtained status information signal.

* * * * *

UNITED STATES PATENT AND TRADEMARK OFFICE
CERTIFICATE OF CORRECTION

PATENT NO. : 6,647,320 B1
DATED : November 11, 2003
INVENTOR(S) : Naoyuki Inoue

It is certified that error appears in the above-identified patent and that said Letters Patent is hereby corrected as shown below:

Column 11,
Lines 2 and 29, change "status" (2nd occurrence) to -- a failure in an operation --.

Column 12,
Line 19, after "supplying" insert -- to the central processing unit --.
Line 20, change "status" to -- failure in an operation --.
Lines 20-21, after "device" insert -- , -- and delete "to the central processing unit".
Lines 26-27, delete the paragraph break.
Lines 45-46, after "suppling" insert -- to the central processing unit -- and change "providing status" to -- identifying a failure in an operation --.
Lines 47-48, after "device" insert -- , -- and delete "to the central processing unit".

Signed and Sealed this

Eleventh Day of May, 2004

JON W. DUDAS
*Acting Director of the United States Patent and Trademark Office*